United States Patent [19]

Woychik

[11] Patent Number: 5,629,839
[45] Date of Patent: May 13, 1997

[54] MODULE INTERCONNECT ADAPTER FOR REDUCED PARASITIC INDUCTANCE

[75] Inventor: Gerard A. Woychik, Waukesha, Wis.

[73] Assignee: Allen-Bradley Company, Inc., Milwaukee, Wis.

[21] Appl. No.: 527,315

[22] Filed: Sep. 12, 1995

[51] Int. Cl.⁶ .................................. H05K 1/11; H01R 9/09
[52] U.S. Cl. .......................... 361/803; 361/784; 439/55; 439/65
[58] Field of Search .................... 174/52.1, 52.4, 174/255, 262; 257/678, 723, 724; 361/729, 736, 784, 785, 790, 803; 439/55, 65; 333/246, 247

[56] References Cited

U.S. PATENT DOCUMENTS

| 5,031,072 | 7/1991 | Malhi et al. | 361/729 |
| 5,059,557 | 10/1991 | Cragon et al. | 257/723 |
| 5,343,366 | 8/1994 | Cipolla et al. | 361/785 |
| 5,484,965 | 1/1996 | Woychik | 439/65 |
| 5,545,924 | 8/1996 | Contolatis et al. | 257/723 |

FOREIGN PATENT DOCUMENTS

| 2442570 | 6/1980 | France | 361/803 |
| 52-2376 | 10/1977 | Japan | 257/723 |
| 1-248590 | 10/1989 | Japan | 439/65 |
| 6-196833 | 7/1994 | Japan | 439/55 |

*Primary Examiner*—Donald Sparks
*Attorney, Agent, or Firm*—Joseph N. Ziebert; John M. Miller; John J. Horn

[57] ABSTRACT

A mounting for a solderable component module (SCM™) interconnect includes an elongated trench or blind via for receiving an edge of the module. The interconnect may be adjusted to reduce the parasitic inductance associated with the connection of the SCM interconnect and the motherboard. Preferably, the design of the finger connectors associated with the SCM interconnect or other board module can be adjusted to reduce parasitic inductance. Alternatively, the capacitance associated with the SCM interconnect or motherboard may be adjusted. The SCM interconnect preferably includes finger connectors which have a rectangular shape. The finger connectors preferably have a shape wherein the length is greater than the width and have an enhanced thickness which reduces parasitic inductance. The finger connectors are spaced close together.

6 Claims, 6 Drawing Sheets

MODULE INTERCONNECT ADAPTER FOR REDUCED PARASITIC INDUCTANCE

CROSS-REFERENCE TO RELATED APPLICATIONS

The present application is related to U.S. patent application Ser. No. 08/292,491, filed Aug. 18, 1994 by Wieloch assigned to the assignee of the present invention. The present application is also related to U.S. application Ser. No. 08/527,720 entitled, "Circuit Board Having a Window Adapted to Receive a Single In-line Package Module," filed by Woychik on an even date herewith, and assigned to the assignee of the present invention.

FIELD OF THE INVENTION

The present invention relates to a connection between circuit boards, and more particularly to an SCM interconnect which is adapted to reduce parasitic inductance.

BACKGROUND OF THE INVENTION

In general, circuit boards (e.g., motherboard) often contain single in-line package (SIP) modules such as circuit boards, electrical devices, resistors, capacitors, or other electronic equipment. The SIP modules often include leads, fingers, pins, or other interface members arranged in a single line. The modules are mounted to the motherboard in a perpendicular fashion to maximize the number of devices, components, circuit boards, or equipment attached to the motherboard.

Generally, the modules require module interconnection systems (e.g., connectors, header assemblies, or other hardware) to interface the module with the motherboard. Module interconnection systems often include pins bent at a 90 degree angle. First ends of the pins are inserted into holes in the module, and second ends of the pins are inserted into holes in the motherboard. An insulating frame is provided between the first and second ends. The frame which is located proximate the 90° bend in the pins is usually rectangularly shaped and provides a stable seat or structure between the motherboard and module. The first and second ends of the pins are soldered to contact areas proximate the holes on the module and motherboard, respectively. Alternatively, module interconnection systems may include slot edge connectors, card connectors, or other printed circuit (PC) board connectors.

Such interconnection systems are not only expensive, bulky, and add to the cost of assembling the motherboard, but create significant impedance matching problems in high power applications such as inverters, converters, motor controllers, power supplies, and other devices. For example, motor controllers must often include snubbing circuits, or other resistive (R), capacitive (C), or inductive (L) networks for reducing the parasitic inductive effects related to the interconnection system utilized to connect power substrates to the motherboard.

Typically, interconnection systems create parasitic inductive effects between the module and the motherboard. With such systems, the module cannot electrically be viewed as though it is part of the motherboard. Thus, there is a need for an interconnection system which has reduced parasitic inductive effects. In addition, there is a need for a module interconnection system which allows the module to be electrically viewed as though it is part of the motherboard.

SUMMARY OF THE INVENTION

The present invention relates to a board module having finger connectors at an edge of the module, a first circuit board layer having a mounting area for receiving the board module, and a second circuit board layer having an aperture. The aperture is configured so that the mounting area is exposed to receive the edge of the board module. The finger connectors of the module correspond to the mounting area and are configured to reduce parasitic inductance at the mounting area.

The present invention also relates to a circuit board system having a mounting board including a conductive pattern which is adapted to support at least one mounted board also including a conductive pattern. The mounted board is received within the mounting board along a mounting edge of the mounting board at an angle less than 180° and greater than 0°, and at least one electrical connection is made between the mounting board and the mounted board. The system includes a mounting area disposed in the mounting board. The mounting area receives the mounting edge. The mounting edge includes connectors configured to reduce parasitic inductive effects associated with the connection.

The present invention also relates to a circuit board system having a mounting board and a mounted board. The mounting board and mounted board each include a conductive pattern. The mounted board is received within the mounting board along a mounting edge at an angle less than 180° and greater than 0° on the mounting board. At least one electrical connection is made between the mounting board and the mounted board. The mounting board includes a mounting surface having a mounting area. The mounting area is disposed in the mounting surface of the mounting board and is configured to receive the mounting edge of the mounted board. The mounting edge includes connectors configured to minimize parasitic inductive effects associated with the connection.

According to one aspect of the present invention, the structure of the module to motherboard interconnection allows the interconnection to be tuned for appropriate impedances (e.g., capacitance and/or inductance). The connector interface can be balanced for particular modules, motherboards, or alternating current (AC) electronic applications by changing the parasitic inductance and the capacitance associated with the connection. The parasitic inductance and capacitance can be adjusted by increasing or decreasing the number of connectors, altering the shape of the connectors, changing the geometry of the module or motherboard, or otherwise manipulating design criteria related to the connector interface.

In another aspect of the present invention, the parasitic inductance associated with the connection can be decreased by increasing the number of finger connectors on the module. The small footprint associated with the interconnection allows the circuit board designer to have optimum space for altering the number of finger connectors at the interconnection. The inherent capacitance associated with the motherboard and module can also be increased by decreasing the thickness between the conductive planes in the circuit board. Therefore, the size and structure of the interconnection between the module and motherboard can be tuned or adjusted to provide an almost ideal connection between the module and the motherboard. Proper RLC tuning allows the module to be electrically viewed as through it is part of the motherboard.

BRIEF DESCRIPTION OF THE DRAWINGS

Preferred embodiments of the invention will hereinafter be described in conjunction with the appended drawings, wherein like numerals denote like elements, and.

DETAILED DESCRIPTION OF PREFERRED EXEMPLARY EMBODIMENTS

Figure 1:
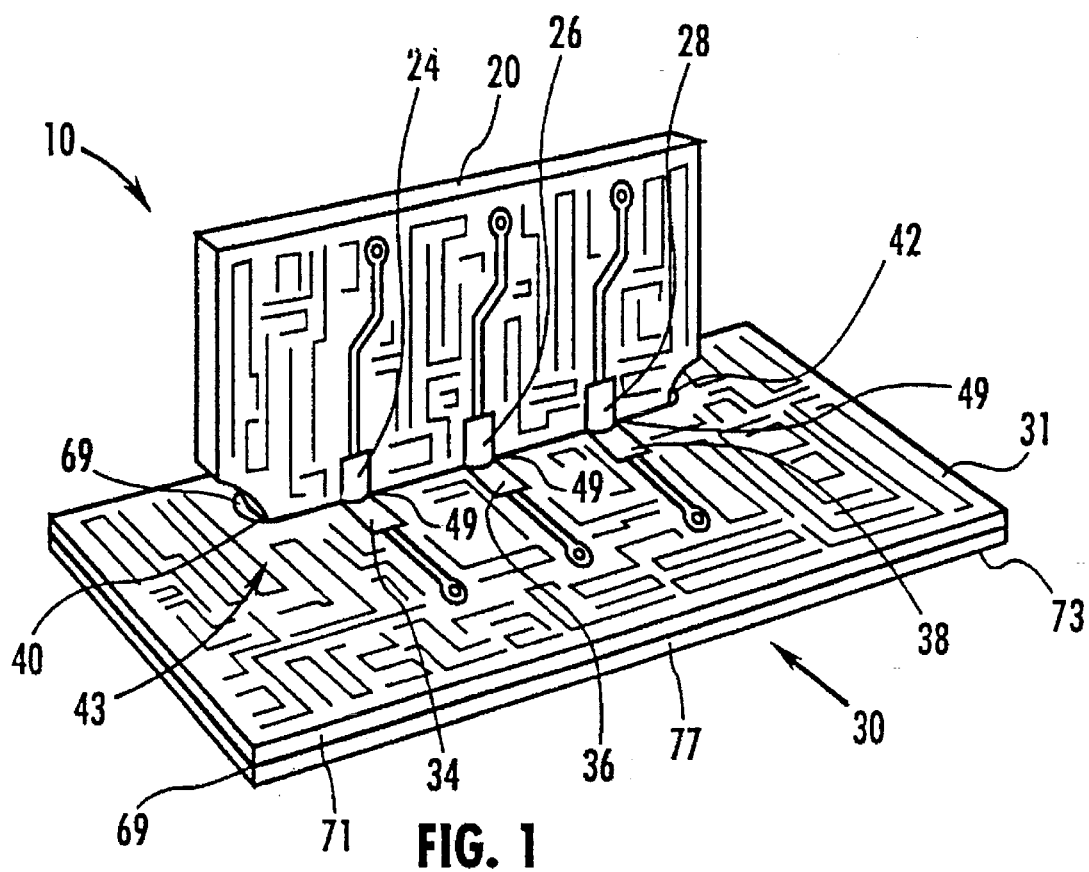
FIG. 1 is a perspective view of an SCM interconnect and motherboard in accordance with a preferred exemplary embodiment of the present invention.

FIG. 1 shows a circuit board system 10 including a mounted board, SIP module, SCM interconnect, or module 20 mounted in a perpendicular fashion on a parent board or motherboard 30. Circuit board system 15 may be utilized in a variety of electrical and electronic environments to perform numerous applications. Circuit board system 15 may include one or more boards 30 each configured to support one or more modules 20.

Module 20 is mounted within a window or trench 40 in a mounting area 43 of motherboard 30. Finger connectors 24, 26 and 28 are in electrical communication with finger connectors 34, 36 and 38, respectively, on a top surface 31, when module 20 engages mounting board or motherboard 30. Module 20 is supported by an interior wall 42 of trench 40. Trench 40 preferably extends from top surface 31 of board 30 to a surface 69. Surface 69 is between top surface 31 and a bottom surface 73 of board 30. Interior wall 42 includes hemicylinders 49 (discussed in more detail below) physically and electrically coupled to connectors 34, 36 and 38.

System 15 advantageously transfers the stresses on module 20 into motherboard 30 without weakening the coupling between module 20 and board 30 (e.g., the solder or epoxy joints in trench 40). System 15 utilizes the inherent strength associated with board 30 to provide a stable mounting for module 20. Trench 40 can be designed to provide a size-on-size fit, interference fit, or strain relief fit for module 20.

Figure 2:
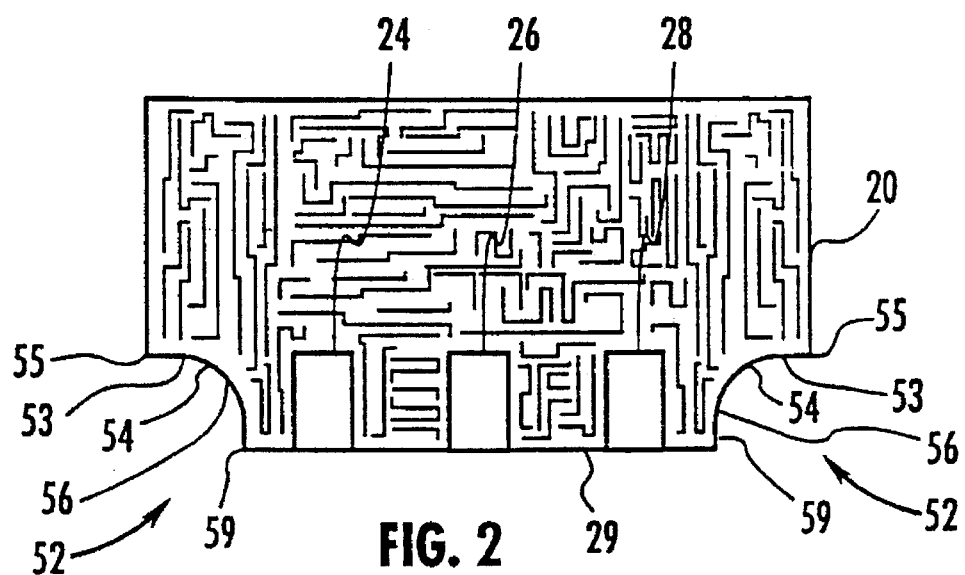
FIG. 2 is a side view of the SCM interconnect illustrated in FIG. 1.

With reference to FIG. 2, module 20 is a structure such as a printed circuit board including a conductive pattern, electrical components and associated circuitry. Alternatively, module 20 may be a resistor package, electronics device, integrated circuit, or other electrical arrangement. Module 20 allows a large number of components to be housed on a relatively small area of board 30. Module 20 includes knee regions 52 proximate an edge 29. Knee regions 52 structurally support module 20 in trench 40.

With reference to FIGS. 1, 3, 4, and 5, motherboard 30 includes a top layer 71 and a bottom layer 77. Alternatively, motherboard 30 can be a single layer or multilayer circuit board. Board 30 may include numerous mounting areas such as mounting area 43 and may include connectors similar to connectors 34, 36 and 38 on surfaces 31, 69 and 73 of board 30.

Board 30 includes mounting area 43 (FIG. 3) having a generally oval shaped trench 40 defined by a partially plated interior wall 42. Interior wall 42 includes hemicylinders 49 about the periphery of trench 40. Hemicylinders 49 are in electrical communication with connectors 34, 36 and 38. Hemicylinders 49 provide a stable electrical contact and physical mounting for module 20 in trench 40 of board 30.

Hemicylinders 49 are advantageously fabricated by providing features (e.g., drilling holes for pins of standard integrated circuit packages) in layer 71 of board 30. The holes are plated, having a hollow conductive via or a metal barrel which extends from top surface 31 to surface 69. When layer 71 is cut, milled, or otherwise configured to form an aperture for trench 40, the holes are sliced (e.g., the edges of trench 40 cross the plated holes), thereby forming hemicylinders 49. Thus, pc board fabrication techniques can be utilized to efficiently produce the difficult to manufacture hemicylinders 49 about the periphery of trench 40.

Trench 40 is advantageously shaped to allow module 20 to be easily attached to board 30. Trench 40 may be an elongated oval or other shape for receiving module 20. Preferably, trench 40 is configured for an interference, friction, or size-on-size fit with knee regions 52 of module 20 (FIG. 2). Trench 40 includes arcuate regions 63 and arcuate regions 62, which define points 61. Alternatively, trench 40 can be configured for a looser (e.g., larger) fit than a size-on-size fit.

Preferably, points 61 engage and deform against regions 52 of module 20 as edge 29 of module 20 is pushed into trench 40. Module 20 is advantageously positioned with connectors 34, 36, and 38 aligning with connectors 24, 26, and 28, respectively, and centered within trench 40 as points 61 are deformed. Knee regions 52 should be positioned in the center of arcuate regions 63 once module 20 engages trench 40. The interference fit provided by points 61 holds module 20 captive as it is attached and yet distances module 20 away from interior wall 42 to allow solder wicking. Solder wicking allows a stable physical and electrical connection to be formed between module 20 and board 30. The configuration of system 15 having trench 40 allows module 20 to be wave soldered, eutectic soldered, reflow soldered, attached with conductive epoxy or otherwise attached to board 30 in an economical fashion.

In accordance with a preferred exemplary embodiment, dimensions related to module 20 and board 30 are discussed below. With reference to FIG. 2, knee regions 52 have arcuate sections 54 having a radius of 0.046 inches. The distance from a point 55 to a point 56 is approximately 0.078 inches along an axis parallel to edge 29. The distance from a point 59 to a point 53 along an axis perpendicular to edge 29 is 0.071 inches. Edge 29 has a width of 0.249 inches and a thickness of 0.062 inches.

Trench 40 is preferably 0.040 inches deep. Alternatively, board 30 may include multiple layers such as layer 70 and be more than 0.040 inches deep.

Figure 3:
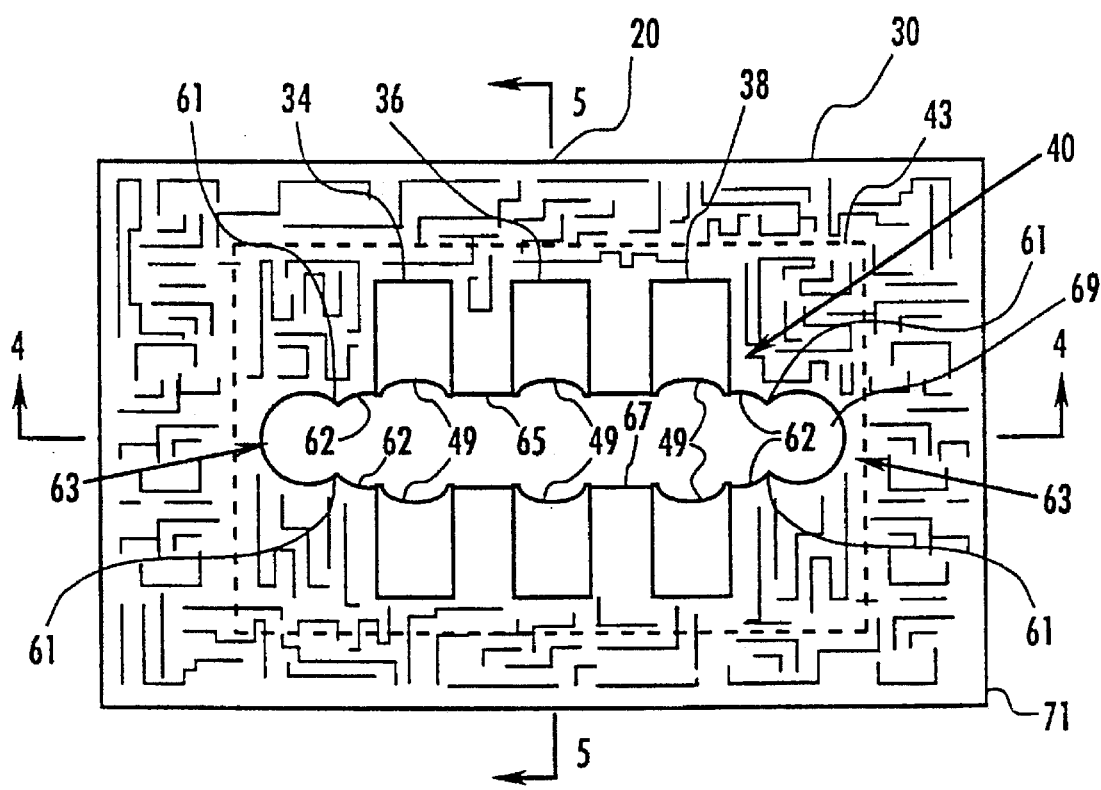
FIG. 3 is a top view of the motherboard illustrated in FIG. 1 in accordance with a first exemplary aspect of the present invention.
Figure 4:
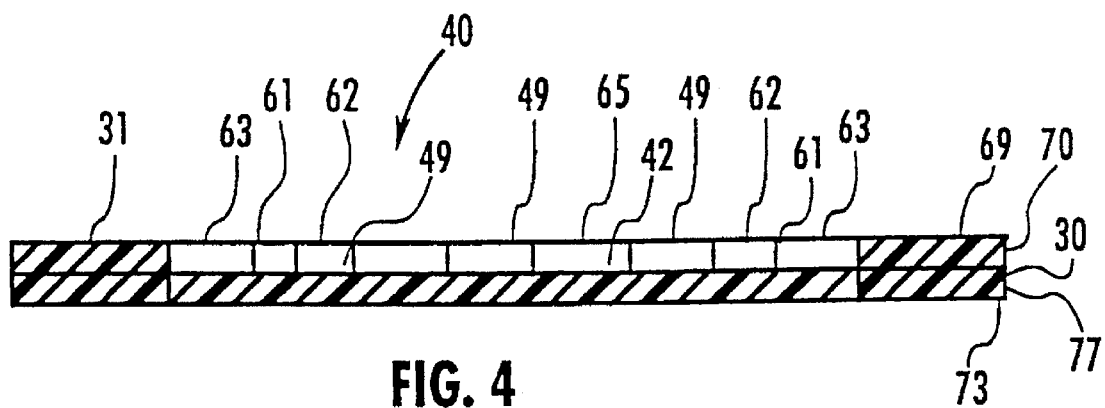
FIG. 4 is a section view of the motherboard illustrated in FIG. 3 along line 4—4.
Figure 5:
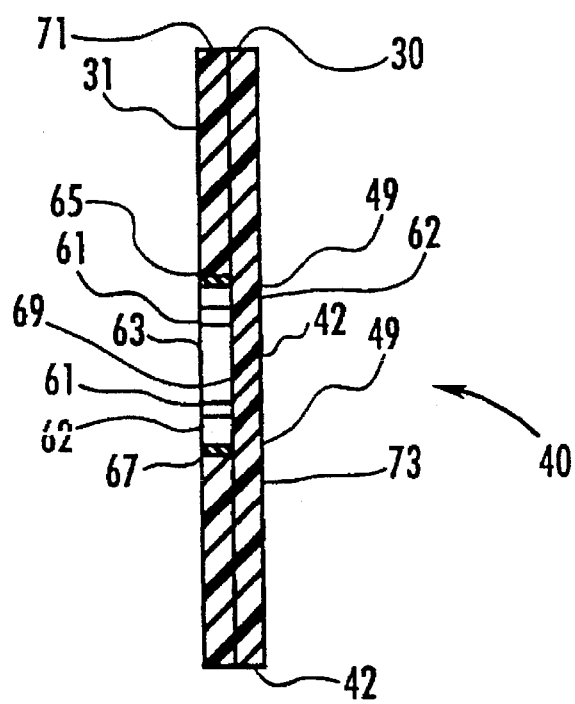
FIG. 5 is a section view of the motherboard illustrated in FIG. 3 along line 5—5.

With reference to FIGS. 3, 4, and 5, points 61 are formed by providing arcuate regions 63 at the ends of elongated trench 40. Arcuate regions 63 have a radius of 0.038 inches. Points 61 extend 0.012 inches from edges 65 and 67 along an axis perpendicular to edges 65 and 67. The width of trench 40 from edge 65 to edge 67 is 0.075 inches. Preferably, trench 40 is slightly wider (e.g., 0.008 inches) than the thickness of module 20 at edge 29.

Motherboard 30 may be manufactured utilizing economical circuit board fabrication techniques. With reference to FIGS. 3–4, motherboard 30 is manufactured according to the following method. Generally, features such as the holes associated with hemicylinders 49 or other mounting areas are provided on layers 71 and 77 of board 30. The holes are plated with copper. Trench 40 for mounting area 43 is then cut into layer 71.

After cutting, trench 40 is etched to provide a smooth or clean interior wall 42. Etching trench 40 removes portions of the plated holes associated with hemicylinders 49 or connectors 34, 36, and 38 which may have been partially removed or altered during the cutting of trench 40. A clean interior wall 42 allows module 20 to be easily inserted into trench 40 and attached to motherboard 30. Also, a clean interior wall 42 ensures a secure electrical contact between connectors 24, 26 and 28 and connectors 34, 36 and 38, respectively. After etching, layer 71 is attached to layer 77 to form board 30.

The fabrication of board 30 including mounting area 43 is described as follows more particularly explaining each process step. The holes required for hemicylinders 49 are drilled into layers 71 of board 30 about the periphery of trench 40 which has not yet been milled.

Layer 71 is copper plated according to an electroless copper plating technique. Electroless copper plating techniques include chemically depositing copper across layer 71. Interior walls of the holes associated with hemicylinders 49, as well as other apertures, are coated with a copper layer in this step forming conducting vias or copper barrels. Next, layer 71 is copper plated with an electrolytic panel plating technique, thereby making the copper layer thicker.

A photoresist is applied to layer 71 in a pattern representative of the connections and electrical devices which will be provided on board 30. The photoresist preferably defines footprints, contacts for mounting area 43 (e.g., connectors 34, 36 and 38), and copper conductors on board 30. The photoresist prevents additional plating of copper on layer 71 wherever the photoresist is present. Next, layer 71 is further plated with an electrolytic copper panel plating technique, followed by a copper pattern plating technique, and a tin lead (solder) pattern plating technique. The tin lead plating acts as an etch resist.

After the tin lead is placed on layer 71, layer 71 is milled to form a slot for trench 40. The milling of layer 71 leaves burrs or extra copper material in the slot for trench 40. Generally, the mill cutter, drill, or router is not able to make a clean cut through the plated holes associated with hemicylinders 49. The cutter tends to push or fold an edge of the plated holes associated with hemicylinders 49 into the slot for trench 40. Also, the cutter tends to separate the plated holes from the dielectric material associated with layer 71. Extraneous copper in trench 40 prevents a proper fit for module 30 against interior wall 42 and interferes with proper electrical communication between module 20 and board 30.

To alleviate the problems associated with the extraneous copper, trench 40 is etched in a step described below.

After trench 40 is formed, the photoresist is then stripped from layer 71. Next, layer 71 is etched to reveal the pattern which was provided in the photoresist step. The etching further removes most of the extra copper and burrs which have been pushed into trench 40. Layer 71 is then coated with the solder mask and reflow soldered with tin lead conductive material such as solder. Reflow soldering may be accomplished by plunging board 30 in a bath of solder and either a hot air solder leveling the tin lead solder or placing board 30 in an oven and heating beyond the eutectic temperature. Reflow soldering ensures an electrically conductive mounting area 43 (e.g. finger connectors 34, 36 and 38 and hemicylinders 49). Layer 71 is then attached to layer 77 to form board 30 having trench 40. Layer 77 can be prepared utilizing standard circuit board fabrication techniques.

In another embodiment, layer 71 is manufactured according to similar steps. However, the milling step is preferably performed after the stripping the photoresist step instead of after the panel plating step as described above. Layer 71 is etched after the milling step to remove the excess copper in trench 40 to provide clean interior walls 42 for a secure fit and reliable electric contact for module 20.

Trench 40 can be provided in board 30 by fabricating (e.g. machining, molding, etching) an aperture in layer 71 to expose a contact area. The aperture may be fabricated before or after layer 71 is secured (e.g. adhered) to layer 71 as discussed in U.S. patent application Ser. No. 08/292,491.

Figure 6:
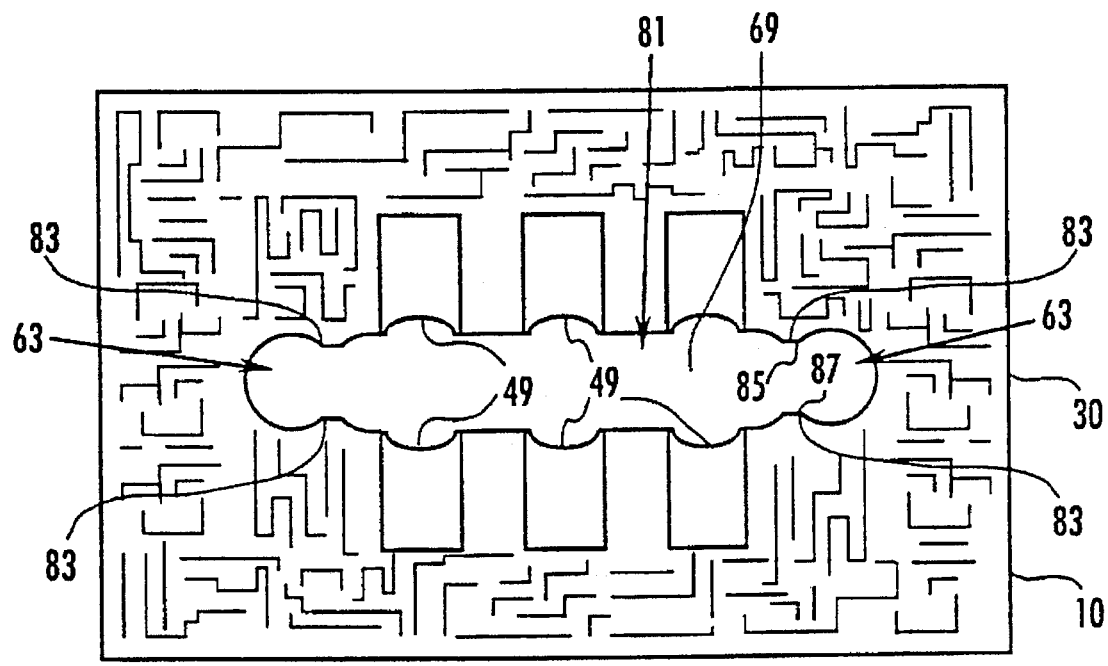
FIG. 6 is a top view of the motherboard illustrated in FIG. 1 in accordance with a second exemplary aspect of the present invention.

FIG. 6 illustrates another embodiment of a motherboard 30 including a trench 81 similar to trench 40 discussed with reference to FIG. 1. Trench 81 is configured for size-on-size fit with module 20 and does not include points 61 discussed with reference to FIGS. 3–5. Regions 83 are in close conformance with knee regions 52 and provide the size-on-size fit for system 15. Trench 81 has an approximate width of 0.062 inches between an edge 85 and an edge 87 at regions 83.

Figure 7:
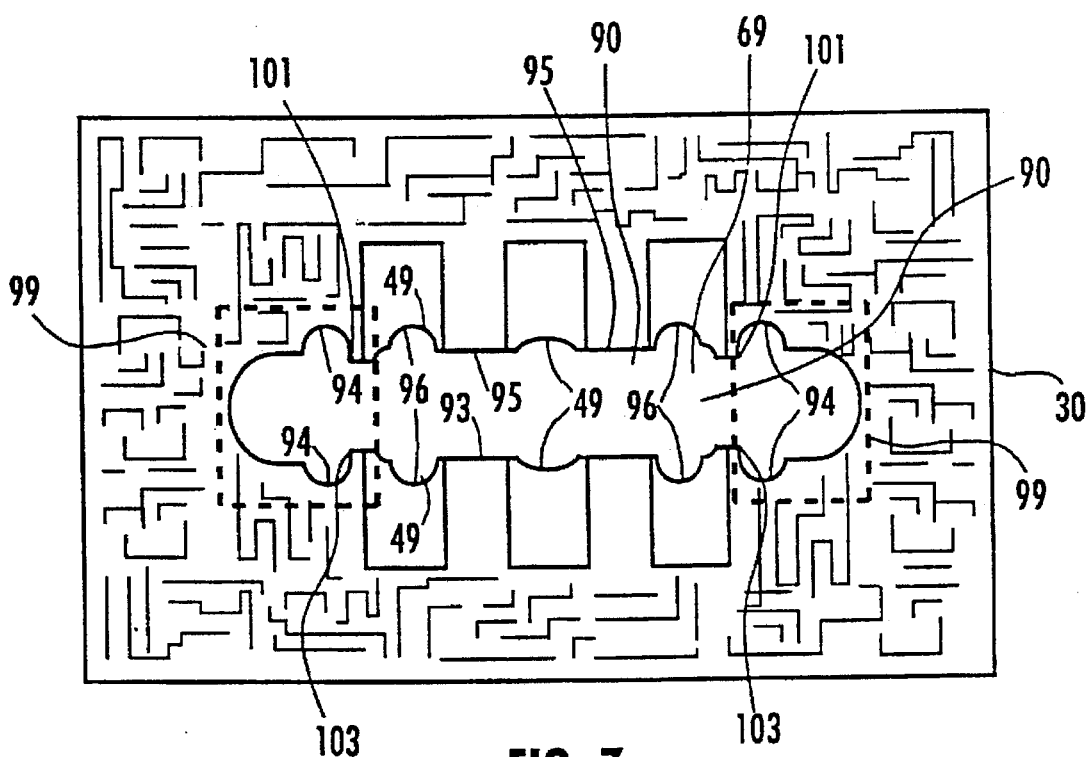
FIG. 7 is a top view of the motherboard illustrated in FIG. 1 in accordance with a third exemplary aspect of the present invention.

With reference to FIG. 7, motherboard 30 includes a trench 90 in accordance with another embodiment similar to trench 81. Trench 90 includes strain relief regions such as regions 94 and regions 96. Additionally, trench 90 is 0.013 inches wider from edge 95 to edge 93 than the width of trench 90 from edge 101 to edge 103. Strain relief regions 94 and 96 advantageously attenuate the forces transferred from module 20 to motherboard 30 when module 20 is bumped, moved or otherwise stressed. Strain relief regions 94 and 96 are semi-circles having a radius of 0.035 inches. The width of trench 90 from edge 101 to edge 103 is 0.075 inches, thereby providing a size-on-size fit with module 20. A rib (not shown) of solder mask (e.g., 0.007–0.009 inches thick) can be disposed vertically from edge 29 of module 20. The rib provides a more stable fit for module 20 in trench 90.

Figure 8:
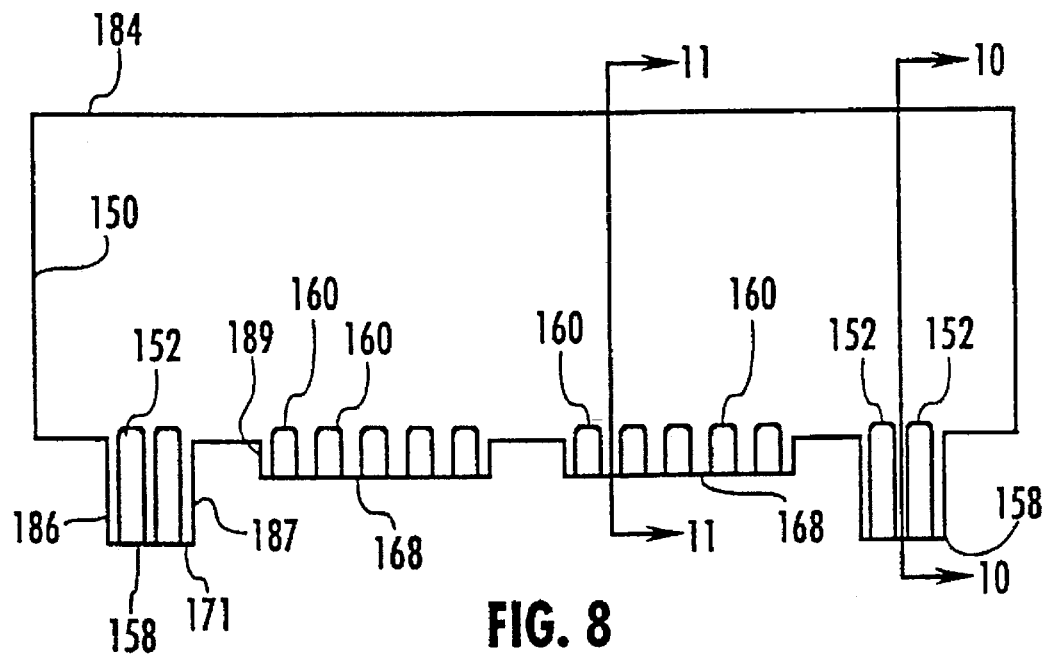
FIG. 8 is a side view of an SCM interconnect in accordance with a fourth exemplary embodiment of the present invention.

FIG. 8 shows a module 150 which is similar to module 20 discussed with reference to FIG. 2. Module 150 is a structure such as a printed circuit board. Module 150 includes long finger connectors 152 disposed on long legs 158 and short finger connectors 160 disposed on trench or mounting legs 168.

Figure 9:
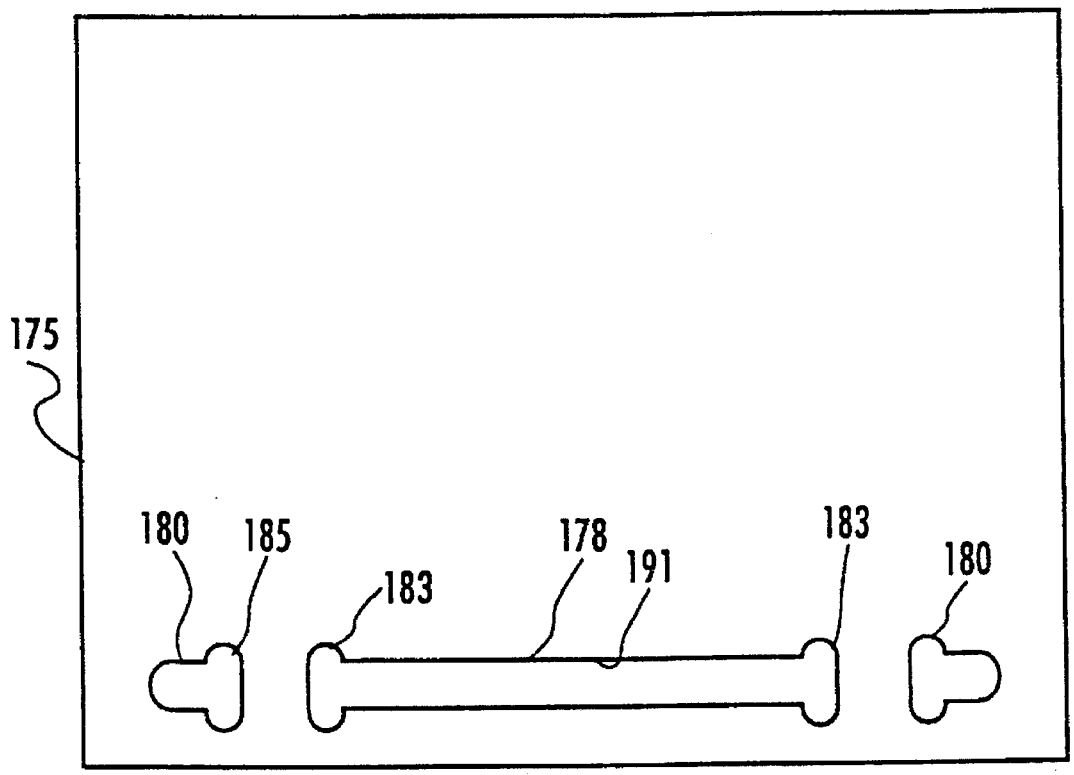
FIG. 9 is a perspective view of a motherboard in accordance with a fifth embodiment of the present invention.

With reference to FIG. 9, motherboard 175 is similar to motherboard 30 illustrated in FIGS. 1–7. Motherboard 175 includes a trench 178 and mounting holes 180. Trench 178 and holes 180 are similar to trench 81 (FIG. 6). Trench 178 includes strain relief areas 183, and mounting holes 180 include strain relief areas 185. Trench 178 and mounting holes 180 can be located anywhere on motherboard 175.

Further, motherboard 175 may include several trenches 178 and mounting holes 180.

In accordance with a preferred exemplary embodiment, dimensions related to motherboard 175 and module 150 are discussed below. Legs 158 are 0.08 inches in height from edge 191, 0.10 inches wide, and 0.062 inches thick. Mounting legs 168 are 0.030 inches in height from edge 191 of module 150, 0.40 inches wide, and 0.062 inches thick. An edge 186 of legs 158 are positioned 0.050 inches from an edge 184 of module 150. An edge 187 of legs 158 are 0.050 inches from an edge 189 of mounting legs 168. Legs 168 are separated from each other by approximately 0.60 inches. The width and height of entire module 150 is approximately 1.050 inches and 0.030 inches, respectively.

Legs 158 and 168 connect to edge 191 at knee regions 193. Knee regions 193 have a radius of 0.046 inches from edge 191. Legs 158 can include plated finger connectors (not shown) at a bottom end 199 of module 150. The plated finger connectors are created utilizing the same techniques used to make hemicylinders 49 (see FIGS. 1, 3, 4 and 5). Preferably, the plated finger connectors are cut from a single line of large holes so that the connectors are relatively flat. A non-plated hole (not shown) may be drilled between the connectors before cutting to ensure an insulative gap between the connectors.

Trench 178 and holes 170 are preferably dimensioned accordingly for a size-on-size fit to match the dimensions of legs 168 and 158, respectively. Preferably, trench 178 and holes 170 are slightly wider (e.g., 0.008 inches wider) than the thickness of module 150. Locating regions 180 and 185 have a width of 0.046 inches than the width of trench 178 and holes 170.

Figure 10:
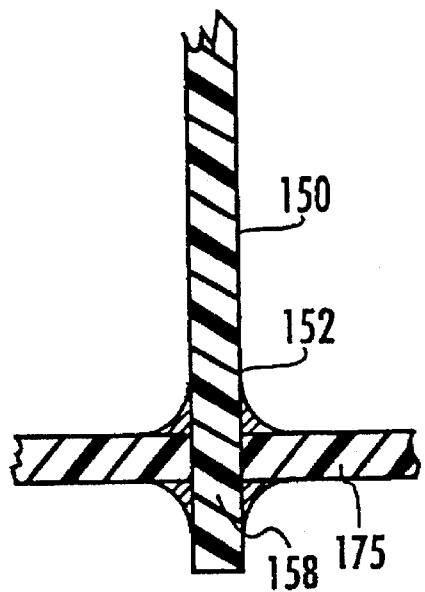
FIG. 10 is a sectional view along line 10—10 of the motherboard illustrated in FIG. 9 attached to the SCM interconnect illustrated in FIG. 8.
Figure 11:
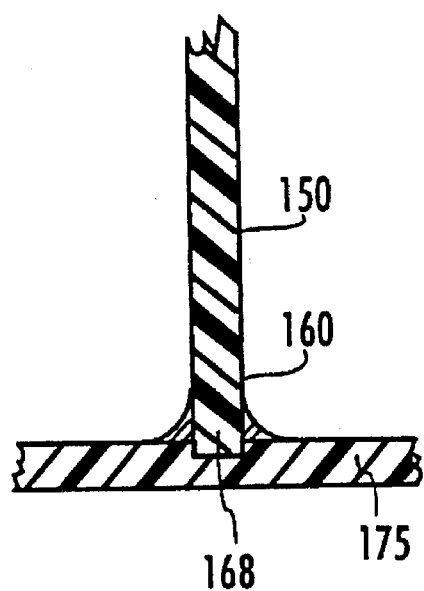
FIG. 11 is a sectional view along line 11—11 of the motherboard illustrated in FIG. 9 attached to the SCM interconnect illustrated in FIG. 8.

With reference to FIGS. 8–11, module 150 slides into trench 178 and holes 180. Long legs 158 protrude into holes 180 to provide a stable mechanical and electrical fit between board 175 and module 150. Legs 158 preferably protrude all the way through board 175 as shown in FIG. 10. Legs 168 fit into trench 178 and may be reflow soldered, attached with conductive epoxy, or otherwise connected to board 175 in an economical fashion. Preferably, solder or conductive epoxy wicks between board 175 and module 150 as shown in FIGS. 10 and 11 to form a stable mechanical connection.

Alternatively, connectors (not shown) can be provided on a bottom surface 184 to interface with the plated-through connector on end 199 of module 150. Holes (not shown) can be provided in surface 184 of trench 178 so that a wave soldering technique can be used to attach module 150 to board 175. The solder preferably wicks through the hole (not shown) to attach the plated finger connector at a bottom edge 199 of module 150 to the connectors on surface 184 of trench 178. Preferably, the connectors in trench 178 are 0.050 inches wide and the holes have a diameter of 0.046 inches wide and are disposed in the center of the connector. Alternatively, the hole may be produced from two smaller holes stacked on top of each other in a figure-eight fashion.

The above described configuration of the interface between module 150 and board 175 reduces the capacitance and inductance associated with connectors such as finger connectors 24, 26, 28, 34, 36 and 38. The epoxy or solder electrical connection between module 150 and board 175 advantageously reduces capacitive and inductive effects by reducing the lead lengths associated with the interconnection of module 150 and board 175.

Additionally, the connection between module 150 and board 175 (or module 20 and board 30 in FIGS. 1–7) can be configured to reduce the parasitic inductive effects which are often problematic in power applications such as in variable frequency motor drive circuits, inverters, converters, or other alternating current (AC) control circuits. The number of finger connectors 152 and 160 can be increased to reduce the parasitic inductive effects. More particularly, several connectors (as many as 30 to 40 in certain applications) of connectors 152 and 160 can be dedicated for power leads. These dedicated connectors of connectors 152 and 160 can be disposed side by side with each adjacent connector 152 and 160 having current flowing in the opposite direction to cancel parasitic inductance. The relatively small size required for the connection of modules 152 and 175 advantageously extends the space for designing geometries and configurations for connectors 152 and 160 to control the capacitance and inductance associated with the connection.

Connectors 152 and 160 can also be dimensioned to reduce the parasitic inductive effects. The length and width of connectors 152 and 160 is minimized to reduce the parasitic conductive effects. Further, the thickness of connectors 152 and 160 is maximized to reduce the parasitic inductive effects. Preferably, connectors 152 and 160 have a thickness of 0.0015 inches, a width of 0.040 inches, and a length of 0.080 inches. Connectors 152 and 160 are preferably 0.020 inches apart from each other. Alternatively, other dimensions can be utilized for particular electrical applications or different modules 150.

The parasitic inductive effects associated with the connection of module 150 and board 175 can be tuned to an inherent capacitance associated with module 150 to impedance match module 150 and board 175. The inherent capacitance in module 150 can be adjusted by changing board thickness, conductive point sizes, dielectric materials, or other design criteria. As stated above, the inductive effects associated with connectors 152 and 160 can be adjusted to match the inherent capacitance of module of 150. Preferably, the inductive effects associated with module 150 are balanced or tuned so that a near ideal connection exists (module 150 can be electrically viewed as though it is a part of board 175).

The dimensions of the holes, trenches, slots, modules, and circuit boards may be advantageously optimized for best reliability and structural stability. For example, hemicylinders 49 having an arc greater than 180° are less susceptible to separation from board 30. The arc of hemicylinders 49 are preferably sized from approximately 200°–220°. Further, the shape and dimensions of trenches 40, 81 and 90 of board 30, and of trench 178 and apertures or holes 180 of board 175, and of edge 29 of module 20 and legs 168 and 158 of module 150 may be varied. The various dimensions discussed with reference to FIGS. 1–11 are exemplary only and do not limit the scope of the invention as defined in the claims. System 15 may be configured having slots, trenches, legs, edges, apertures, hemicylinders, widths, knee regions, and other features of various shapes and sizes.

It is understood that, while the detailed drawings, specific examples, and particular materials given describe a preferred exemplary embodiment of the present invention, they are for the purpose of illustration only. The method and apparatus of the invention is not limited to the precise details and conditions disclosed. For example, although particular shapes of apertures are described, the circuit board may be configured with other various shaped apertures. Although only one board or module is mounted in a single slot, the parent or motherboard may include a multitude of slots and house a multitude of modules. Also, trenches 40 and 178 can be a number of layers deep. Various changes may be made to the details disclosed without departing from the spirit of the invention which is defined by the following claims.

What is claimed is:

1. A multilayer circuit board system, comprising:

a board module having finger connectors at an edge of the module;

a first circuit board layer having a mounting area for receiving the board module; and a second board layer having an aperture, the aperture comprising hemicylindrical contacts and configured so that the mounting area is exposed to receive the edge of the board module, Wherein the finger connectors of the module corresponds to the mounting area and wherein the finger connectors of the module are spaced 0.020 inches apart from each other to reduce parasitic inductance at the mounting area.

2. A multilayer circuit board system, comprising:

a board module having finger connectors at an edge of the module;

a first circuit board layer having a mounting area for receiving the board module; and a second board layer having an aperture, the aperture comprising hemicylindrical contacts and configured so that the mounting area is exposed to receive the edge of the board module, wherein the finger connectors of the module corresponds to the mounting area and wherein connectors of the module have a thickness of greater than 0.33 times the width to reduce parasitic inductance at the mounting area.

3. The multilayer circuit board of claim 2, wherein the thickness is 0.0015 inches, a length of the finger connectors is 0.080 inches, and the width is 0.040 inches.

4. A multilayer circuit board system, comprising:

a board module having finger connectors at an edge of the module;

a first circuit board layer having a mounting area for receiving the board module; wherein the mounting area includes mounting area finger connectors located in a trench in the mounting area, the finger connectors including a plurality of dedicated power conductors located adjacent each other, wherein adjacent power conductors carry current traveling in opposite directions to reduce parasitic inductive effects; and a second board layer having an aperture, the aperture comprising hemicylindrical contacts and configured so that the mounting area is exposed to receive the edge of the board module, wherein the finger connectors of the module corresponds to the mounting area, the finger connectors of the module being configured 0.020 inches apart.

5. A circuit board system having a mounting board including a conductive pattern, the mounting board adapted to support at least one mounted board also including a conductive pattern, wherein the mounted board is received within the mounting board along a mounting edge of the mounted board at an angle less than 180 degrees and greater the 0 degrees and, further wherein at least one hemicylindrical electrical connection is made between the mounting board and the mounted board, said system comprising:

a mounting area disposed in said mounting board, the mounting area receiving the mounting edge, the mounting edge including hemicylindrical connectors configured to reduce parasitic inductive effects associated with the connection, wherein the finger connectors have a length of 0.080 inches, a width of 0.040 inches, and a thickness of 0.0015 inches.

6. In a circuit board system having a mounting board and a mounted board, the mounting board and mounted board each including a conductive pattern, Wherein the mounted board is received within the mounting board along a mounting edge at an angle less than 180 degrees and greater than 0 degrees on the mounting board and further wherein at least one hemicylindrical electrical connection is made between the mounting board and mounted board, said mounting board comprising:

a mounting surface including a mounting area, the mounting area disposed in said mounting surface of said mounting board, the mounting area being configured to receive the mounting edge of the mounted board, the mounting edge including hemicylindrical connectors configured to minimize parasitic inductive effects associated with the connection, wherein the finger connectors have enhanced thickness to reduce the parasitic inductive effects associated with the connection.

* * * * *